United States Patent
Canonico et al.

(10) Patent No.: US 10,173,284 B2
(45) Date of Patent: Jan. 8, 2019

(54) METHOD FOR MAKING FLEXIBLE CIRCUITS

(75) Inventors: Paolo Canonico, Appiano Gentile (IT); Carmine Lucignano, Appiano Gentile (IT)

(73) Assignee: SAATI S.P.A., Appiano Gentile (CO) (IT)

( * ) Notice: Subject to any disclaimer, the term of this patent is extended or adjusted under 35 U.S.C. 154(b) by 282 days.

(21) Appl. No.: 14/426,241

(22) PCT Filed: Sep. 6, 2012

(86) PCT No.: PCT/IB2012/001724
§ 371 (c)(1),
(2), (4) Date: Mar. 5, 2015

(87) PCT Pub. No.: WO2014/037755
PCT Pub. Date: Mar. 13, 2014

(65) Prior Publication Data
US 2015/0217406 A1   Aug. 6, 2015

(51) Int. Cl.
| | |
|---|---|
| *B23K 26/36* | (2014.01) |
| *D06M 11/83* | (2006.01) |
| *H05K 1/03* | (2006.01) |
| *H05K 3/02* | (2006.01) |
| *D06M 10/00* | (2006.01) |
| *D06M 23/16* | (2006.01) |
| *B23K 26/362* | (2014.01) |
| *B23K 26/361* | (2014.01) |

(52) U.S. Cl.
CPC .......... *B23K 26/365* (2013.01); *B23K 26/361* (2015.10); *B23K 26/362* (2013.01); *D06M 10/005* (2013.01); *D06M 11/83* (2013.01); *D06M 23/16* (2013.01); *H05K 1/038* (2013.01); *H05K 3/027* (2013.01); *H05K 2201/029* (2013.01); *H05K 2203/107* (2013.01)

(58) Field of Classification Search
CPC ................ B23K 26/362; B23K 26/365; B23K 26/0823; B23K 26/0853; D06M 10/005; D06M 11/83; D06M 23/16; H05K 3/027; H05K 1/038; D03D 15/00
USPC ....................................... 442/60; 219/121.69
See application file for complete search history.

(56) References Cited

U.S. PATENT DOCUMENTS

| | | | | |
|---|---|---|---|---|
| 5,017,423 A | * | 5/1991 | Bossmann | B29C 59/16 219/121.65 |
| 2008/0083706 A1 | * | 4/2008 | Kirmeier | B23K 26/0084 219/72 |
| 2009/0181592 A1 | | 7/2009 | Dugan | |
| 2011/0120981 A1 | * | 5/2011 | Paganelli | B23K 26/0823 219/121.67 |
| 2011/0217892 A1 | * | 9/2011 | Chabrecek | B41F 15/34 442/60 |

FOREIGN PATENT DOCUMENTS

DE    202008017480 U1    4/2010

OTHER PUBLICATIONS

International Search Report in corresponding application dated May 31, 2013.

* cited by examiner

*Primary Examiner* — Brian Jennison
(74) *Attorney, Agent, or Firm* — Hedman & Costigan, P.C.; James V. Costigan; Kathleen A. Costigan

(57) ABSTRACT

A method for removing a metal from a single-thread fabric for making a pattern, characterized in that said single-thread fabric is a square-mesh metallized and etching laser made fabric.

13 Claims, No Drawings

METHOD FOR MAKING FLEXIBLE CIRCUITS

BACKGROUND OF THE INVENTION

The present invention relates to a method for making flexible circuits.

At present, flexible circuits are mainly made by depositing a conductive pattern on a film of a polymeric material such as polyester, and polyimide, followed by a chemical removal process for removing parts not pertaining to the circuit being made.

Flexible circuits may also be made by suitably metallized textile substrates.

Is also herein mentioned the well known etching process in which the material is mainly removed by chemical radical reactions with the substrate.

The etching chemical process is performed for creating preset patterns on a metallized fabric material.

A first stage of a chemical etching process is to prepare functional masks for forming on the metallized fabric a desired pattern.

By a photolithographic or photo-etching process, the thus made pattern is transferred from its mask to a thin layer of a UV radiation sensible material covering the surface of a textile substrate.

In order to generate the target flexible electronic elements, an etching or chemical process is performed for selectively removing unmasked portions of the fabric material covering metal layer.

The photolithographic steps are as follows:
applying the photosensible film (resist) on the substrate;
exposing to a UV radiation the resist film at regions thereof not covered by the pattern defined on a photolithographic mask contacting the substrate;
developing the resist film at the exposed regions thereof (the so called positive process);
etching the metal film underlining the photo sensitive film at the regions not covered thereby;
stripping.

The developing is the operating step which mostly affects the pattern quality.

The etching is the process used for tracing elements, consisting of eliminating excess metal while leaving only the designed circuit connections.

The removal is carried out by an acid bath.

Etching reagent, etching time and related temperature and stirring are the main factors controlling this process.

The stripping is the process carried out for removing a still present photosensible film.

It is important that the stripping procedure does not negatively affect the underlying metal layer and does not cause contamination thereof.

SUMMARY OF THE INVENTION

The aim of the present invention is to provide novel flexible circuits and a novel process for making them.

Within the scope of the above mentioned aim, a main object of the invention is to provide flexible circuits allowing the electronics to be used in applications and places at which it was not previously used.

Another object of the present invention is to provide a method for making flexible circuits having novel and interesting aspect ratios.

Yet another object of the present invention is to provide such a method allowing to further miniaturize and improve the electronics.

According to an aspect of the present invention, the above mentioned aim and objects, as well as yet other objects, which will become more apparent hereinafter, are achieved by a flexible circuit characterized in that said flexible circuit comprises a flexible circuit base comprising a synthetic single-thread square mesh precision fabric having a conductive pattern integrated therein.

The method for making the above flexible circuit comprises an application step for applying a metal material through an overall surface of the synthetic single-thread fabric followed by a removal step for removing excess metal to achieve a preset pattern.

Further characteristics and advantages of the present invention will become more apparent from the following disclosure of a preferred though not exclusive embodiment of the invention which is illustrated, by way of an indicative but not limitative example, in the following disclosure.

As stated, a flexible circuit according to the present invention is based on a synthetic single-thread even mesh precision fabric material.

A very even texture, with a coherent mesh opening through the overall fabric, a high mechanical strength and processing characteristics, makes the subject precision single-thread fabric material an ideal solution as a basic material for all applications requiring a very good resilient, lightness, perspiring, precision, and performance evenness.

The above very even fabric materials show much more constant properties in the terms of weight, thickness, surface characteristics, temperature performance, than other flexible substrates, such as polymeric films, TNTs, multi-thread fabrics, papers and so on.

The characteristic evenness is held constant along the overall fabric roll and from batch to batch.

The above fabrics are made with very strict tolerances, thereby providing a textile substrate having a preset high flow permeability and modulable and reproducible electric characteristics.

The characteristics evenness is a result of correspondingly even pore size and single-thread properties and of the single-thread used in weaving.

Moreover, the subject precision fabrics have a very good resistance against atmospheric agents, water and moisture and may be made on an industrial scale with a stable and reproducible quality.

Moreover, the subject fabrics, used in the inventive flexible circuits, are made starting from a polyester, polyamide, polypropylene, polyethere-sulfone, polyimide, polyamideimide, polyphenylensulphide, polyethereketone, polyvinyldenfluoride, polytetrafluoroethylene, single-thread, with a mesh opening range from 2,500 to 0 microns. Alternatively, it is also possible to use multi-thread fabrics made of an aramide fiber material.

The textile construction of the single-thread fabric materials may have the following characteristics: 4-600 threads/cm; a thread diameter from 10 to 500 microns, a weaved structure, a weight from 15 to 300 g/square meter; a thickness from 15 to 1,000 microns.

Several variations of the subject fabric may be used as a substrate for making the inventive flexible circuits, and the fabric made by the herein disclosed method has perspiring, modular and highly flexible characteristics; moreover, it also has mechanical characteristics providing it with an improved duration and fatigue resistance. As a starting fabric material it is possible to use a washed and thermally fixed "white"

fabric, a colored fabric, a plasma processed fabric or a hydrophobic, hydrophilic, antibacteric processed fabric and the like.

According to the present invention, a method is herein also provided for making the integrated flexible circuit on a textile base.

With the words "flexible electronics" flexible electric and electronic circuits are herein intended.

The system used for making flexible conductive elements integrated in the subject precision synthetic single-thread fabrics is a novel process based on a combination of several technologies.

The result consists of a plurality of electric and electronic elements having a functional performance designed for target applications and improved flexibility, lightness, integrating, shape and size properties.

The process comprises a step of applying a metal material on one or both the surfaces of the synthetic single-thread fabric, which is preferably carried out, according to the present invention, by sputtering or a galvanic depositing or alternately by CVD, PVD process, a chemical depositing, or alternatively a laminating of different metal sheet elements on the synthetic single-thread fabric.

The metal coatings applied to the fabric may have a thickness varying from 10 to 5,000 nm and the coating may be a single-layer or a multi-layer coating arrangement.

The above mentioned metal coatings may consist of different metals, alloys thereof and semiconductors, preferably selected from: nickel, gold, steel, copper, silver, aluminum, titanium, chromium, tin, indium-tin oxide, zinc-aluminum oxide, tin-fluorine oxide, tin-antimonium oxide.

The metal removing step is carried out by a quick and localized evaporation of said metal by the so called "laser etching" process which may be applied to the metal coated fabrics by the above disclosed methods.

The method for making a novel synthetic single-thread square mesh fabric according to the present invention is characterized in that the starting thread surfaces (before the weaving thereof) are not metallized, that at least one of the two surfaces of the fabric is at least partially metallized, and that portions of the contacting surfaces of the overlying threads are not metallized, for forming metal collets at the end portions of said surfaces.

The synthetics single-thread fabrics made by the subject method are such that their partial metallization, of any arrangement, or pattern, on at least one of the two surfaces, together with the metal collets forming at the end of the overlapping thread contacting surfaces, provide the desired continuity/electrical conductibility between two points selected on the same thread, between two points selected in the same direction but on different threads, between two points considered on different threads and different directions between any fabric points.

Thus, by the subject method, a fabric is provided in which the unmetallized contact surfaces portions between the overlapping threads, and the metal collets between the end portions of said surfaces provide the desired electric conductivity properties and an improved size stability and a reduced weight with respect to the same type of metallized fabric made by the same metal alloy and having the metallization also on overlapping thread contacting surfaces.

In this connection it should be pointed out that the subject method provides to make a pattern, that is a flexible circuit by removing metal materials from the metallized square-mesh single-thread fabric made by an etching laser method, that is by removing metal from the fabric by a quick and localized evaporation.

This result is achieved by a specifically designed laser source, so selected as to prevent fabric combustion, melting or degrading phenomena from occurring.

The above disclosed process may be applied to a comparatively broad range of synthetic single-thread fabrics, differentiated from one another by the chemical nature of the single-thread used in weaving, such as PET, PA, PES, PI, PAI, PPS, PEEK, PTFE and so on, and by the textile weaving construction (threads/cm, thread diameter, weaving, weight, thickness), for the finishing and surface processing operations (washed and thermoset "white" fabric, colored fabric, plasma processed fabric, metallized fabric and so on).

The two above disclosed process stages and related method may be applied with the most suitable combination for achieving the flexible circuit based on an application to be implemented.

The sputtering coating is one of the most flexible methods for physically depositing a metal or a non-metal coating on a textile surface.

The coating material is introduced into the vacuum chamber as a cathode, in the form of a metal plate.

After having vacuumized the chamber, the process gas is supplied thereto (it is herein conventionally used argon due to its high atomic weight). Then, a high voltage is applied and the gas is introduced.

The argon positive ions are subjected to an acceleration process at the negative cathode and then atoms are ejected from the metal plate, to be deposited on the single-thread fabric arranged homogeneously and evenly in the chamber.

Differently from a number of other vacuum depositing methods, no material melting occurs, and accordingly the materials (mainly metals and alloys, but also organic materials) may be deposited with a high efficiency and control.

The metals and alloys preferably used are steel, titanium, copper, aluminum, chromium, noble metals.

More specifically, it is possible to deposit by sputtering diamagnetic alloys and metals.

By the same above technology and equipment it is possible to perform a reactive sputtering: in addition to the process gas, the process chamber is supplied with a reactive gas, such as nitrogen or oxygen, to cause deposited metal nitride or oxide to form on the substrates, such as $TiO_2$ or TiN.

In this connection it should be pointed out that sputtering may be performed on single-thread fabrics both of an insulating or a conductive nature.

Different cathodes, consisting of different materials, may be supplied to a sputtering system, thereby it is also possible to make multi-layered systems.

It is moreover possible to modify the combination of the single layers by varying the reactive gas combination.

The thickness of the covering made by this method varies from tens of nm to microns.

The process speed may vary in the range from 0 to 20 m/min, depending on the thickness of the metallized pattern to be made.

In the so called "magnetron sputtering" method, the depositing system uses a passive device designed for generating a magneto-static field.

The electrically charged particles and ions (which are subjected to the Lorenz force) are offset by the particular field flux lines, thereby impinging several times against the target of which a layer is to be deposited, while greatly enhancing the process yield, since a larger amount of material is introduced into the plasma.

A magnetron sputtering apparatus may comprise up to four magnetrons.

The process parameters are so changed as to obtain different property metal layers (different conductibility values of the made patterns and deposited layer thickness and weight ($g/m^2$)).

The metal layer characteristics may be modulated by properly designing the process parameters.

The sputtering process may be controlled by the parameters thereof (such as the speed of the substrate being processed, the generator power and so on) on the target arranged in the processing chamber, environmental conditions (pressure/vacuum degrees, process gases).

The sputtering deposition allows to achieve very good quality conductive films and, by specifically designed approaches, also allows to achieve surface and aesthetic properties different from those of the starting material in an on-mass phase.

Sputtering provides an incomparable advantage combination: it is the cleanest method among other coating techniques, is economically efficient and provides a coating thickness as thin as possible; it is a dry low temperature process and accordingly does not chemically or thermally affects the textile substrate while preserving its basic characteristics.

Furthermore, this method provides an indestructible binding between the film and substrate, since it welds them together at a molecular level by the Van der Waals forces, provides a greater operating flexibility than that of other coating methods, since, being a cold transfer type of process, it may be used for depositing a broad range of either conductive or insulating materials on each desired types of single-thread fabric, while providing a calibrated and even conductibility through the overall substrate.

The galvanic electrodeposition metallization, in turn, represents a process for making metal coatings on a given surface by exploiting an electric current.

Metal and metal alloy electrodeposition consists of electrolizing an aqueous solution the main components of which are the salts of a metal being used for forming the covering.

In a vat or basin, constituting the so called galvanic bath, and containing an aqueous solution of a metal salt to be deposited, two electrodes are arranged.

To said two electrodes is applied a potential difference by a current generator.

Under such a condition, cations of the metal being deposited will be displaced toward the cathode (being negatively charged) whereas anions will be displaced towards the anode (positively charged).

Under the effect of an electric field generated by a potential differential applied between the two generator electrodes, cations migrate toward the negative pole (cathode) and anions toward the positive one (anode), thereby causing an electric current to pass through the solution.

Upon contacting the electrodes, two oxidation-reduction reactions on the solution ions, with transfer of electrons, respectively, the cathode reduction and anode oxidation occur.

This process is the so called "electrolysis".

In the electrolytic cell, articles to be coated are connected to the negative pole of a DC current source and form the cathode, whereas the anode is coupled to the source positive pole and closes the electric circuit.

The freely movable solution metal cations are discharged on the cathode surface, which is slowly covered by a thin metal layer.

Generally, the anode is constituted by plates or bars of the metal to be deposited and, during the electrolysis, it is consumed to supply the solution ions being discharged onto the cathode.

The electrode processes may include both noble metals such as silver and gold, and common metals, such as nickel, iron, zinc and copper.

The deposited crystalline structure and its mechanical and physical properties, such as conductivity, surface hardness, abrasion resistance, and evenness, depend on the following main operating parameters:

the composition and concentration of the bath electrolyte;
the current density;
the voltage applied to the electrodes;
the temperature;
the pH;
the galvanic bath stirring.

With respect to the metal layer to be deposited, which, usually, is of tens of microns or less, for a given current density value (expressed in $A/dm^2$), at which the bath operates, and knowing the depositing speed or rate, it is sufficient to set the time necessary to provide a desired or target thickness deposit.

The application of a metal by laminating metal foils or sheets consists of making a composite multi-layer structure by using specifically designed pressures and temperatures.

The laminated copper layers have a constant and preset thickness, typically 18, 35 or 70 μm.

Thereinbelow a laser ablation process on the metallized synthetic single-thread fabric, by applying one of the above techniques or methods, will be disclosed.

The method provides to evaporate, in a quick and localized manner, the desired metal, which may be carried out either on one or both the surfaces simultaneously, and by a specifically designed and selected laser source, adapted to prevent fabric combustion, melting or degrading phenomena from occurring.

The materials subjected to the laser ablation process comprise polymeric single-thread fabrics with a metal coating on one or both surfaces thereof, which have different textile construction, weight, thickness and metallization type (different metals, alloys thereof, and semiconductor, preferably selected from the following: nickel, gold, steel, copper, silver, aluminium, chromium, titanium, tin, indium-tin oxide, zinc-aluminium oxide, tin-fluorine oxide, tin-antimonium oxide).

The used laser beam must be so designed as to be absorbed by the metal coating without modifying the polymeric bulk, since the latter is transparent to the laser beam itself.

Said laser beam, moreover, is preferably a low power and high power density beam, has a wavelength of preferably about 1,000 nm, or from 1,080 nm to 354 nm. It may either operate in a continuous regimen or a pulsed regimen, with a frequency preferably from 100 Hz to 500 MHz.

The pulse duration is preferably from 200 ns to 10 femtoseconds, thereby facilitating the vaporizing of the metal layer while limiting the heat diffusion to the bottom substrate.

For the above application a diode laser is preferably used, but, with suitable modifications, it is also possible to use solid status lasers, a fiber laser or a $CO_2$ laser.

The laser beam is focalized on the metallized fabric by a lens assembly or system, with a movement or displacement micrometric adjustment, whilst the movement of the beam through the fabric may be achieved by Cartesian axes, a robot arm, a lens system and/or one or more reflecting mirrors together with a galvanometric head.

Furthermore, the laser beam displacement through the fabric may be achieved by a combined displacement of the beam and fabric, i.e. by any of the above indicated methods, simultaneously with a displacement of the fabric which, in each case, must be held slightly tensioned between two bearing members (preferably a fabric roll, which is slightly tensioned by pulling and counter-pulling forces, is caused to slide under the laser head).

In the case in which multi-layered metal coatings, or other large size fabrics are ablated, in which a combination of a coating thickness and latent evaporation heat of the designed metal achieves such a level as to cause a heat transfer to the polymeric substrate (by a conduction), which could cause a degradation or a melting of the bulk polymer, then a cooling system for providing a quick heat dissipation should be provided.

It is possible to use forced air or refrigerating fluid cooling systems, or a cooling bath or by partially immersing the fabric in a cooling basin. In some cases, in which the thickness or in general the amount of material to be removed is a large one, specifically designed suction systems to prevent removed metal particles from being conveyed through the process fumes and again deposited on the fabric surface, thereby negatively affecting the pattern aesthetic properties, should be used.

The laser ablating process applied to the metallized single-thread fabric is based on a selection of an optimum wavelength, which is absorbed by the metal and passes through the polymer (constituting the synthetic single-thread) without absorption by the latter.

The laser beam has preferably a wavelength from 1,080 nm to 354 nm, a laser power from 5 to 100 W, and a laser spot having preferably a spot size from 10 to 200 microns.

The laser beam, having the above mentioned wavelength, may impinge/operate on both sides of the single-thread fabric; it is absorbed by the metal and removes the latter by evaporation, passes through the polymer which is transparent to the chosen laser wavelength, without etching or modifying it, and is absorbed by the underlying metal, to remove the latter by evaporation.

The laser sources experimentally used on different types of fabrics, differentiated because of their thread chemical composition, textile construction (threads/cm, thread diameter, weave, weight, thickness) for finishing and metallizing operations have been the following two: a laser source having a maximum power of 10 W and a laser emission wavelength of 1,064 nm, a minimum spot size of 50 microns, and a fiber laser source having a maximum power of 30 W, an emission wavelength of 1,070 nm, and a minimum spot size of 80 microns.

As the laser spot size decreases, higher resolution values can be achieved, even if the end result is greatly affected by the used substrate, that is by the thread/cm numbers and thread size.

Moreover, as the thread diameter is decreased, and the number of threads/cm increased, the higher will be the resolution.

Both sources operate in a pulsed regimen and comprise a galvanometric type of laser beam displacement system.

Thus, by the above disclosed method, it is possible to preserve all the peculiar advantages of a laser processing: a good image and pattern contour precision and definition level, a good pattern repeatability, a very short operating time, a simple loading and unloading system for the material being processed (in the case of a roll of a textile material being processed, it is possible to use a prior winding and unwinding system), a great equipment electronic control flexibility allowing to quickly change and modify the pattern to be reproduced by a computer.

This is very different, for example, from a chemical etching process which is much slower, does not allow to process roils and requires to prepare dedicated masks for making the different patterns.

A lot of samples have been made and characterized by the two above disclosed laser systems, on fabric types having different thread chemical compositions and textile constructions (threads/cm, thread diameter, weaving, weight, thickness) and metallization: PES 90.64 metallized by stainless steel, PES 150.27 metallized by stainless steel, PES 180.27 metallized by stainless steel, PES 190.31 metallized by stainless steel, PES 90.40 metallized by nickel, PES 165.34 metallized by nickel, PA 43.61 metallized by nickel, PES 90.64 metallized by copper, PES 190.31 metallized by copper, PA 43.61 metallized by copper, PES 90.64 metallized by aluminium, PES 150.27 metallized by aluminium, PES 180.27 metallized by aluminium, PES 190.31 metallized by aluminium, PES 40.90 calendered and metallized by titanium, PES 90.64 metallized by titanium, PES 150.27 metallized by titanium, PES 180.27 metallized by titanium, and PES 190.31 metallized by titanium.

In the above mentioned codes, the first digit after the polymer identifying abbreviation, identifies the fabric threads/cm number, whereas the second digit identifies the thread diameter.

In each individual case, a laboratory method has been at first used, providing to generate the sample squares by changing the process parameters, in order to identify the optimum operating condition combination range.

From the operating tests it has been found that the metal is fully removed without any damaging of the polymer.

As above mentioned, it has been found that, as the spot size is decreased, then the minimum size of the removed material trace also decreases, which, in any case, is a function of the fabric material used as a substrate.

Upon having selected the optimum process parameters for the particular types of fabrics and metals, and for a demonstrative purpose, much more complex patterns have been made.

For example, more complex and integrated functional circuits have been made for a demonstrative purpose: that is a circuit for switching on a high luminance LED power supplied through USB, a USB power supplied "flip-flop", and a heater circuit.

The purpose of the simple LED switching on circuit has been that of showing an effective possibility of using the subject fabric as a replacement of a common electronic board and verifying the power supply from a PC through a USB port.

The conductive traces or tracks have been made by the above disclosed technologies or methods.

A second application example has been the making of an alternating blinking circuit ("flip-flop").

Such a circuit provides to alternately switch on and off two LCDs (red and green) by two driving transistors having a switching on frequency depending on the capacitance of two capacitors.

As in the first case, the power supply of the circuit was achieved through a USB (5V).

Notwithstanding the more complex construction, by exploiting data achieved from the making of a preceding circuit, the conductive traces have been made in a very simple and quick manner.

It has been found that the invention fully achieves the intended aim and objects.

In fact, the invention has provided a method for making flexible circuits starting from a fabric having the required structural strength and operating flexibility, while holding its permeability and eveness characteristics unaltered.

In addition to its basic characteristics, it also has functional properties since it may be transformed from a passive textile element to a textile "smart" active element.

This could be very useful for industrial applications in several fields, acoustic, motor vehicle, household appliances, healthcare, diagnostics, medical, chemical consumer goods, military, electronics, logistics, advertising and publishing and in general it may be suitably used in all applications in which a high operating flexibility, characteristic eveness such as weight and thickness, high precision and good perspiring, a good heat dissipation are required.

The method according to the present invention allows to use the dedicated electronics in applications for which could not be previously used.

Moreover, the subject method allows to achieve new interesting aspect ratios or shape parameters, while rendering a miniaturizing and electronic advancing possible.

The subject fabrics consist of polymer material single-thread compositions which, by a conductive coating, are transformed into a sort of electric cables, thereby allowing, differently from other substrates such as paper, TNTs or multi-thread fabrics, to make a precise and high resolution circuits.

The eveness of the technical and structural characteristics of the fabric allows to properly adjust the final product properties and achieve a reliable and even operation thereof.

The perspiring of the subject fabrics, moreover, allows to perform, differently from films, an efficient temperature control by an optimum thermal dissipation, since all problems related to a performance variation as temperature increases are eliminated.

The broad product range provides modular approaches, such as for filtering purposes, that is a selection of a substrate providing the better solution (mesh opening, thread diameter, thread/cm number) for the circuit and intended applications.

The fabric flexibility and mechanical properties are much greater than those of prior films.

This allows to overcome the use limitations of prior printed circuit boards due to poor mechanical strength and limited operating flexibility thereof, in which, if the bending radius is greater than a given value, then the conductive layers deposited on the film are broken thereby preventing the device from properly operating and damaging the structures which could not be further operated.

The synthetic single-thread fabrics may be very easily processed or machined (by welding, cutting, drilling and so on), which involves good fitting and assembling facility performance.

Moreover, the metallized fabrics may be cut, folded or bent, and assembled by binding adhesives or stitches.

The method allows a simplified and efficient integration of all electric and electronic components.

The subject fabrics provide a flexible platform thereon it is possible to make, through their integration, all electric and electronic components allowing the device to properly operate, that is from the specific functional electronic component to the electric circuit, related connections and power supply.

In practicing the invention, the used material as, as well as the contingent size and shapes can be any, depending on requirements.

The invention claimed is:

1. A method for making a flexible electronic circuit on a textile base, comprising providing a synthetic single-thread fabric having first and second surfaces and even mesh square openings, and said single-threaded fabric having a weaved structure, and having 4-600 threads/cm, a thread diameter from 10 to 500 microns, a weight from 15 to 300 g/square meter and a thickness from 15 to 1,000 microns, said method further comprising applying a metal coating on one or both of said first and second surfaces, and subsequently removing portions of said metal coating from said fabric to obtain an electronic circuit pattern by a quick and localized evaporation provided by a laser beam generating a low power—high power density laser beam not causing fabric combustion, melting or degrading phenomena and adapted to be absorbed by said metal coating, without modifying a polymeric bulk or said first and second surfaces of said fabric, such that the single threads or monofilaments of said fabric are provided with end metal collets providing an electrical continuity between two points of a same thread, between two points selected in a same direction but on different threads, between two points on different threads and different direction between any fabric points, the method further comprises providing a cooling system for preventing the fabric from being degraded during the metal evaporation by said laser beam, said laser beam operating either with a continuous or a pulsed operating regimen, with a frequency from 100 MHz to 500 MHz, and a laser pulse duration from 200 ns to 20 femtoseconds, thereby facilitating the evaporation of the metal coating while limiting heat diffusion, said laser beam having a laser beam wavelength from 1,080 nm to 354 nm, said laser beam having a laser beam power from 5 to 100 W, said laser beam having a laser beam spot with a spot size from 10 to 200 microns.

2. A method according to claim 1, characterized in that said laser beam is selected from a group consisting of: a diode laser, a solid status laser, and a $CO_2$ laser.

3. A method according to claim 1, characterized in that said method comprises focalizing said laser beam on said fabric by a focalizing lens system including a displacement micrometric adjusting means.

4. A method according to claim 1, characterized in that said method comprises driving said laser beam by driving Cartesian axes, a robot arm, a lens system and one or more galvanometric head reflecting mirrors.

5. A method according to claim 1, characterized in that said method comprises displacing said laser beam and fabric through a displacement path formed by a combined displacement of said laser beam and fabric by driving Cartesian axes, a robot arm, a lens system and one or more galvanometric head reflecting mirrors and by a simultaneous displacement of the fabric.

6. A method according to claim 1, characterized in that said metal coating is simultaneously removed from one or both of said surfaces of the fabric.

7. A method according to claim 1, characterized in that said method comprises making the metallized fabric on which the laser process is performed by applying one or more metal layers overlapped on either one or both of said surfaces of the fabric.

8. A method according to claim 1, characterized in that said single-thread fabric is metallized by sputtering, PVD, CVD, a galvanic deposition or a chemical deposition.

9. A method according to claim 1, characterized in that said metal coating has a thickness from 10 to 5,000 nm, said coating being a single-layer or a multi-layer coating.

10. A method according to claim 1, characterized in that said metal coating comprises metals, alloys thereof and semiconductors being selected from nickel, gold, steel, copper, silver, aluminium, chromium, titanium, tin, indium-tin oxide, zinc-aluminium oxide, tin-fluorine oxide, tin-antimonium oxide.

11. A method according to claim 1, characterized in that said synthetic single-thread fabric is made from a material selected from the group consisting of:
polyester, polyamide, polypropylene, polyethere-sulfone, polyimide, polyamideimide, polyphenilene-sulphide, polyetheretherketone, polyvinylidenefluoride, polytetrafluoroethylene, and aramide.

12. A method according to claim 1, characterized in that said fabric has perspiring properties.

13. A method according to claim 1, characterized in that said fabric is an electrically conductive pattern fabric.

* * * * *